United States Patent [19]
Fritsch

[11] Patent Number: 4,934,578
[45] Date of Patent: Jun. 19, 1990

[54] APPARATUS FOR MOUNTING AND/OR SOLDERING OR CEMENTING ELECTRONIC COMPONENTS ON PRINTED CIRCUIT BOARDS

[76] Inventor: Adalbert Fritsch, Haus Nr. 46, D-8455 Kastl, Fed. Rep. of Germany

[21] Appl. No.: 340,122

[22] Filed: Apr. 18, 1989

[30] Foreign Application Priority Data

Apr. 19, 1988 [DE] Fed. Rep. of Germany ....... 3813097

[51] Int. Cl.$^5$ ............................................. B23K 37/00
[52] U.S. Cl. ..................... 228/6.2; 228/49.1; 221/95; 221/154; 221/211
[58] Field of Search ............ 228/6.2, 44.7, 49.1, 228/47, 180.2; 221/87, 95, 154, 211

[56] References Cited

U.S. PATENT DOCUMENTS

| | | | |
|---|---|---|---|
| 3,893,232 | 7/1975 | Fletcher et al. | 221/95 |
| 4,151,945 | 5/1979 | Ragard et al. | 228/6.2 |
| 4,617,728 | 10/1986 | Andersen et al. | 221/211 |

FOREIGN PATENT DOCUMENTS

| | | | |
|---|---|---|---|
| 63835 | 4/1982 | Japan | 228/6.2 |
| 63836 | 4/1982 | Japan | 228/6.2 |
| 790037 | 12/1980 | U.S.S.R. | 228/6.2 |

OTHER PUBLICATIONS

IBM Technical Disclosure Bulletin, "Auto Chip Transfer Tool", vol. 28, No. 7, pp. 2811,2812, Dec. 1985.

Primary Examiner—Nicholas P. Godici
Assistant Examiner—Samuel M. Heinrich
Attorney, Agent, or Firm—Scully, Scott, Murphy & Presser

[57] ABSTRACT

In an apparatus for mounting and/or soldering or cementing electronic components, in particular SMD components, on printed circuit boards, haing a first carrier for at least one circuit board and a second carrier for the component, the first and second carriers being displaceable relative to one another parallel to the plane of the circuit board and transverse thereto, and having a magazine for the components which has chambers to receive the components, mixing up of the components can be largely avoided while ensuring that it is simple to remove the components from the magazine by providing the chambers with a lid that can be opened and closed by means of a fastening mechanism and having the fastening mechanism opened by the second carrier.

28 Claims, 4 Drawing Sheets

APPARATUS FOR MOUNTING AND/OR SOLDERING OR CEMENTING ELECTRONIC COMPONENTS ON PRINTED CIRCUIT BOARDS

TECHNICAL FIELD OF THE INVENTION

The invention relates to apparatus for mounting and-/or soldering or cementing electronic components, in particular SMD components, on printed circuit boards, having a first carrier for at least one circuit board and a second carrier for the component, the first and second carriers being displaceable relative to one another parallel to the plane of the circuit board and transverse thereto, and having a magazine for the components which has chambers to receive the components.

BACKGROUND OF THE INVENTION AND PRIOR ART

Apparatus of this kind is used in manufacturing and repairing printed circuit boards and has proved its worth. In the apparatus the tool accommodating the electronic component may be adapted to both mount and solder or cement the component to the printed circuit board or either to mount or solder or cement the component to the printed circuit board. In the above-mentioned apparatus the first carrier or the second carrier can be displaced, which can be done by hand.

When mounting components on printed circuit boards the identification and arrangement of the components causes problems, particularly when dealing with small components such as so-called SMD (small mounted device) components, whose dimensions often do not exceed 1 mm. Even if the components are marked identification and arrangement is difficult and time consuming and the operator has to be particularly attentive in order to carry out the identification and arrangement.

OBJECT OF THE INVENTION

It is an object of the invention to design a device of the kind mentioned in the introduction which, while ensuring simple removal of the components from the magazine, substantially avoids mixing up the components.

SUMMARY OF THE INVENTION

This object is achieved as set forth in claims 1 and 9.

The solutions according to the invention have in common that the components are accommodated in normally closed magazine chambers which are opened for removing the components and after the removal are closed again. By this means both an incorrect removal, namely the removal of a component from the wrong magazine chamber, and mixing up of the components with the components from other magazine chambers is prevented to the greatest possible extent and thus the danger of incorrect mounting of components is reduced. Furthermore handling the components is made easier if the magazine chambers are removable as in claim 5, whereby filling and emptying is dispensed with since the components can also be stored in the magazine boxes outside of the device in a simple manner.

In the embodiment of the invention in claim 1 opening the magazine chamber being used is done in an operationally simple manner by the carrier for the component. By this means simple and quick removal is possible because the associated carrier must in any case be displaced to the removing position where the component can as a rule be removed from the magazine chamber by means of a special tool head, preferably with a suction needle.

In the solution according to the invention claimed in claim 9 opening the associated magazine chamber is done automatically by an opening mechanism which opens the fastening mechanism of the respective magazine chamber that is moved into the use position.

The features set forth in the subclaims lead to improvements of the device or individual parts of the same with regard to simplicity of form, economical manufacture, space saving and/or rational manner of operation. Thus the further developments according to the invention concern not only the removal of the components from the magazine chambers, but also the mounting or removal of the magazine boxes containing the magazine chambers on or from carriers provided for this purpose. For this purpose quick release connections in the form of latch or clamping or clipping mechanisms are preferably used which make it possible to fit or remove the magazine boxes in a simple, easy to operate and quick way.

BRIEF DESCRIPTION OF THE DRAWINGS

The invention will now be explained in more detail with reference to exemplary embodiments shown in simplified drawings, in which.

DETAILED DESCRIPTION OF PREFERRED EMBODIMENTS OF THE INVENTION

Figure 2:
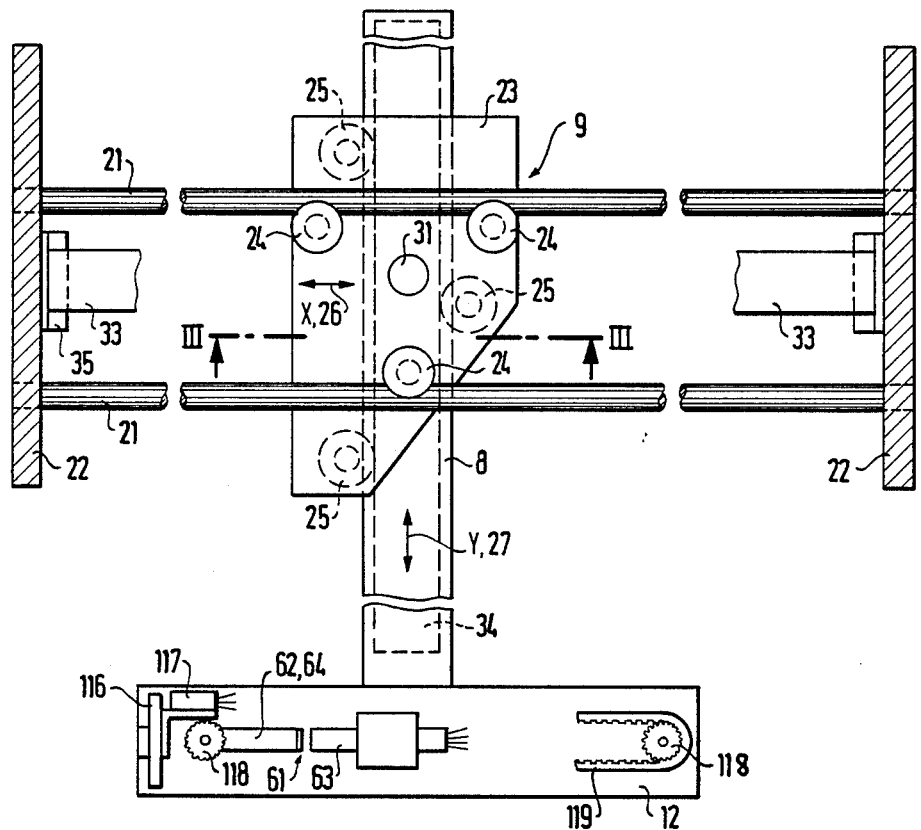
FIG. 2 shows a cross-guide for a guide arm of the device carrying a tool head in a plan view.

The essential parts of the device in the form of a manipulator, generally indicated by 2, are a frame 3 for supporting printed circuit boards 4, which relative to the operating side 5 of the device 2 is arranged at the front, a bridge-shaped guide part 6 offset towards the rear relative to the supporting frame 3 and extending parallel to the operating side 5, having attached to the underside of its horizontal crossbeam 7, in a cross guide 9 shown in FIG. 2, a guide arm 8 mounted to be displaced substantially at right angles to and parallel to the operating side 5, a mounting head 12 arranged on the end of the guide arm 8 facing the operating side 5 and having a handle 13 which the operator grips in order to displace the guide arm 8 as desired parallel to the plane of the printed circuit board 4, a magazine 14 for electronic components 15 arranged, in the present exemplary embodiment, to the left of the supporting frame 3, and a tray 16 arranged to the right of and next to the supporting frame 3 which for adaptation to printed circuit boards 4 of different sizes is displaceably guided on a frame 17 that carries the supporting frame 3 and on which the hand of the operator guiding the mounting head 12 can be placed.

To the front of the crossbeam 7 the control elements determining the functioning of the device are arranged.

The motion coordinates of the guide arm 8, on which the mounting tool, which in this exemplary embodiment is a suction needle 18, carried by the tool head 12 can be displaced in the plane of the printed circuit board 4 at each point in the coordinate system, i.e. at each point on the printed circuit board, are indicated by X and Y.

A further vertical direction of movement Z is provided for the mounting tool which in the present exemplary embodiment comprises a vertical guide 19 (FIG. 4) between the guide arm 8 and the mounting head 12.

Figure 3:
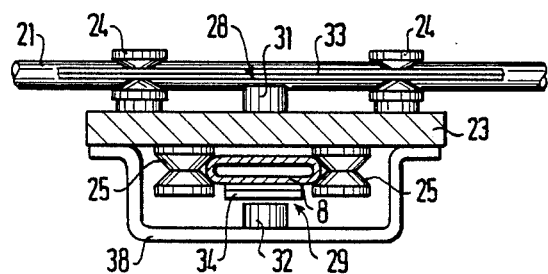
FIG. 3 shows a first brake and a second brake for the guide arm in part section on the line III—III in FIG. 2.

The essential parts of the cross-guide 9 shown in FIG. 2 are two guide rails 21 in the form of circular rods which extend parallel to the X axis in a horizontal plane and are attached to the side walls 22 of the guide part 6, a guide plate 23 which extends between the guide rails 21 and the guide arm 8 (FIG. 3), and sets of three guide rollers 24, 25 of which the guide rollers indicated by 24 cooperate with the guide rails 21 and form the X-guide 26, while the guide rollers indicated by 25 cooperate with the guide arm 8 and form the Y-guide 27. As can be seen in particular in FIG. 3 the guide rollers 24, 25 have an X-shaped outer surface with which they engage over the guide rails 21 and the laterally rounded guide arm 8 so that the guidance is secured in the horizontal plane. The guide arm 8 comprises a flattened tube, i.e. it has flat upper and lower sides and rounded side surfaces. The guide rollers 24, 25 clasp the guide rails 21 and the guide arm 8 respectively at three points, whereby exact guidance is ensured in a simple manner.

Associated with the cross-guide 9 are two brakes 28, 29 of which the brake 28 makes it possible to block as desired the movement of the guide plate 23 in the X-direction and the brake 29 makes it possible to block the movement of the guide arm 8 in the Y-direction. The brakes 28, 29 are electromagnetic brakes each having a respective electromagnet 31, 32 and an associated braking element, which in the present exemplary embodiment is rod-shaped, namely a metal strip 33, 34 of ferromagnetic material which extends along the X- or Y-direction. The brakes 28, 29 can be seen in detail in FIG. 3. The metal strip 33 of the X-brake 28 is attached to the side walls 22 by means of fastening brackets 35 while the metal strip 34 of the Y-brake is attached to the underside of the guide arm 8 preferably by screws arranged at the free ends of the metal strip 34. The metal strips 33, 34 each comprise two flat strips arranged over one another between which is an insulating layer or an insulating strip of soft or ductile or elastic material. In the present exemplary embodiment a double-sided adhesive strip, preferably of plastics material or paper is used and preferably stuck to the flat strips 36. Hereby vibrations and the production of acoustic tones when the brake acts are prevented.

Since the metal strips 33, 34 do not yield in their longitudinal direction or are held so that they do not yield, operation of the brake 28, 29 by closing an electric circuit (not shown) which includes the associated electromagnet 31, 32 results in exact positioning of the guide arm 8 or of the mounting head 12 in the respective direction of movement. It is also important that the electromagnets 31, 32 are each arranged on the underside of the respective associated metal strip 33, 34 whereby interference to the operation of the brakes 28, 29 caused by dirt is prevented. In the present exemplary embodiment the electromagnet 31 of the X-brake 28 is arranged on the guide plate 23 while the electromagnet 32 of the Y-brake 29 is arranged beneath the guide arm 8 on a U-strap 38 gripping thereunder which is attached to the underside of the guide plate 23 by screws.

The mounting tool formed by the suction needle 18 is displaceable in the vertical Z-guide, indicated generally by 19, by vertically displacing the mounting head 12. Furthermore the suction needle 18 is displaceable, preferably by only a few millimeters, in the mounting head 12 in a vertical guide indicated by 39, as indicated by the double arrow $Z_1$.

Both vertical guides 19, 39 are roller bearing guides and are thus of high precision. The Z-guide 19 has a vertical circular guide rod 43 which is displaceable with a roller bearing cage in a vertical guide piece 44 attached to the guide arm 8. In order to prevent horizontal rotation of the mounting head 12 about the guide rod 43 a second vertical guide rod 45 is arranged in the box-shaped housing 46 of the mounting head 12, which is likewise precisely clasped in a fork-like manner by a lateral projection 47 on the guide piece 44. By means of a leaf spring 48 acting between the guide piece 44 or its attached parts and the housing 46 the mounting head 12 is urged towards its upper end position.

The vertical guide 19 likewise has associated with it a brake, generally indicated by 51, which is likewise an electromagnetic brake having an electromagnet 52 arranged in an electric circuit (not shown) and a braking surface of ferromagnetic material, which in the present exemplary embodiment is likewise arranged on a metal strip, which is held movably along the electromagnet 52 so that the latter can be arranged non-movably. In the present exemplary embodiment the electromagnet 52 is attached to a support 54 which is attached to the projection 47 extending from the guide piece 44. The metal strip is a small plate 53 which is secured in a vertical position to the side wall 56 of the housing 46 by means of a leaf spring 55 attached to it so that it can be deflected along the electromagnet 52 so as to lie without a gap against its front end when the electromagnet 52 is energised. In all the brakes 28, 29, 51 the arrangement is such that there is a small air gap between the electromagnets 31, 32, 52 and the associated metal strips 33, 34 or small plate 53. This prevents grinding noises when the mounting head 12 is displaced in the released condition of the brake.

In the present exemplary embodiment the mounting tool formed by the suction needle 18 has, on the upper side of the mounting head 12, a switch 61 (FIG. 6) which is activated near the highest position of the suction needle 18 in the direction of movement indicated by $Z_1$. This is a so-called transmission switch, so as to ensure that the switching is performed with the smallest possible movement of the suction needle 18 in the $Z_1$ direction of movement. The switch 61 is a proximity switch having a movable switching element 62 and a stationary switching element 63. The movable switching element 62 is in the form of a lever 64, here with one arm, mounted to pivot vertically at 65, which is urged by means of a spring, preferably a leaf spring 66, into its contact position with the stationary switching element 63. The suction needle 18, which normally occupies its lower position due to its own weight or to spring action, normally pushes with an operating member 67 on the lever 64, whereby the switch 61 is opened. As soon as the suction needle 18 is marginally lifted the switch 61 is closed by means of the leaf spring 66. Since the distance a of the suction needle 18 from the bearing point 65 of the lever 64 is much smaller than the length 1 of the lever 64, preferably only about 1/5 of the length 1, even a small vertical movement of the suction needle 18 is enough to actuate the proximity switch 61.

Associated with the mounting head 12 in the region of the Z-guide 19 is a second switch 71, indicated in outline (FIG. 4), which in a region between the lowest and the highest position of the mounting head 12 (preferably in the middle region) between these positions prevents the brakes 28, 29, 51 from operating. This switch is operated by two guide pieces of the Z-guide displaced relative to one another, here by the housing 46 to which the switch 71 is attached and the guide piece 44.

The magazine 14 includes a magazine rod 81 in the form of a profiled rail having plurality of magazine boxes 82 which - since the present device is intended for mounting small SMD components 15 - are relatively small. They are magazine boxes 82 that can be opened and closed as desired by means of a lid, preferably a hinged cover 83, and which are only opened for the short period needed for mounting. This avoids components 15 unintentionally getting into the wrong magazine boxes 82, and thus prevents incorrect mounting due to this cause.

The magazine 14 is arranged near the supporting frame 3 for the printed circuit boards 4 so as to avoid as far as is possible long transport paths for the components 15 between the magazine 14 and the printed circuit board 4. In the present exemplary embodiment the magazine 14 is located to the left next to the supporting frame 3. It could, however, also be arranged to the right next to and/or in front of or behind the supporting frame 3.

To support the magazine 14, here the magazine rod 81, a magazine holder 84 is arranged on the frame 17 which, like the supporting frame 3, has two horizontal supporting strips 85 of which one is preferably in either the form of a clamping strip 86 or includes such a strip. The magazine rod 81 is inserted between the supporting strips 85 and is held resiliently by means of the clamping strip 86. The arrangement is such that the bottom 87 of the magazine boxes 82 is located approximately at the height of the supported printed circuit board 4.

In each case the hinged lid 83 at the top of the respective magazine box 82 is pivotably mounted about a substantially horizontal hinge 88 on the side of the magazine box 82 facing away from the printed circuit board 4, and has on the side facing the printed circuit board 4 a fastening mechanism, preferably in the form of a latch 89. This latch 89 can be opened manually, preferably with the aid of the mounting tool, here the suction needle 18. The latch 89 has a catch 91 which in the present exemplary embodiment is arranged on a substantially vertical latch arm 92 which can be moved from its engaged position by pushing away laterally and restored by spring force, or preferably elastically, to its engaged position, where it engages with its catch 91 over a locking edge or surface on the hinged lid 83, here over the upper side. In the present exemplary embodiment the catch 91 has on its upper side an inclined surface 93 which is inclined towards the side facing away from the printed circuit board 4. The latch 89 can thus be opened by the suction needle 18 either by a vertical movement downwards or a horizontal movement of the suction needle 18 towards the printed circuit board 4 by pressing against the catch 91. After the catch 91 is released the hinged lid 83 automatically springs upwards like a spring lid.

In order to make opening by means of the suction needle 18 easier the hinged lid 83 has, near the catch 91 and on its side facing away from the printed circuit board 4, a recess 94 which is narrower than the catch 91 so that the latter can engage over the rims of the recess 94.

The magazine boxes 82 preferably consist of plastics material. In the present exemplary embodiment the latch arm 92 is formed integrally with the associated side wall of the magazine box 82, preferably in the form of a double-armed lever, so that the catch 91 is operated as desired by loading the upper or lower lever arm 92.1 (tensile or pressure operation). In the present exemplary embodiment the middle of the latch arm 92 is connected to the side wall 95 by connecting pieces 96, about which it is pivotable in the sense of a hinge 97 with a horizontal axis. In order to ensure free pivotability, recesses 98, 99 are provided on the inside of the latch lever and laterally thereof. The magazine box 82 is an injection molded plastics material part.

On the underside of the magazine box 82 are claw-shaped clamping elements 101 having clamping lugs 102 which engage behind lateral undercuts on the magazine rod 81. The undercuts are formed by inclined surfaces 103 which, owing to their inclined position, makes easy removal of the magazine boxes 82 possible by simply pulling them gently upwards and pressing the clamping elements 101 outwards. In order similarly to facilitate clipping the magazine boxes 82 on to the magazine rod 81 further inclined surfaces 104 in the form of a roof are arranged on the upper side of the inclined surfaces 103 by means of which the clamping elements 101 are pressed apart when clipping on.

In the present exemplary embodiment the magazine boxes 82 are arranged in one row by means of a magazine rod 81. It is also possible to arrange the magazine boxes 82 or magazine rods in two or more rows, in which case a corresponding number of magazine holders 84 would have to be provided.

In order to mount components on a printed circuit board 4 it is held in the supporting frame 3. The supporting frame 3 has for this purpose two further supporting strips 85 extending transverse to the operating side 5, of which the left holding strip is rigid and the right holding strip 85 is displaceable in a guide extending parallel to the operating side 5 or on a guide rail 113 forming this guide, and can be secured as desired by means of a securing screw 120. The upper edges of the holding strips 85 are stepped as mirror images of one another so as to form supports for the printed circuit board 4 and limiting bars engaging laterally over it.

Figure 1:
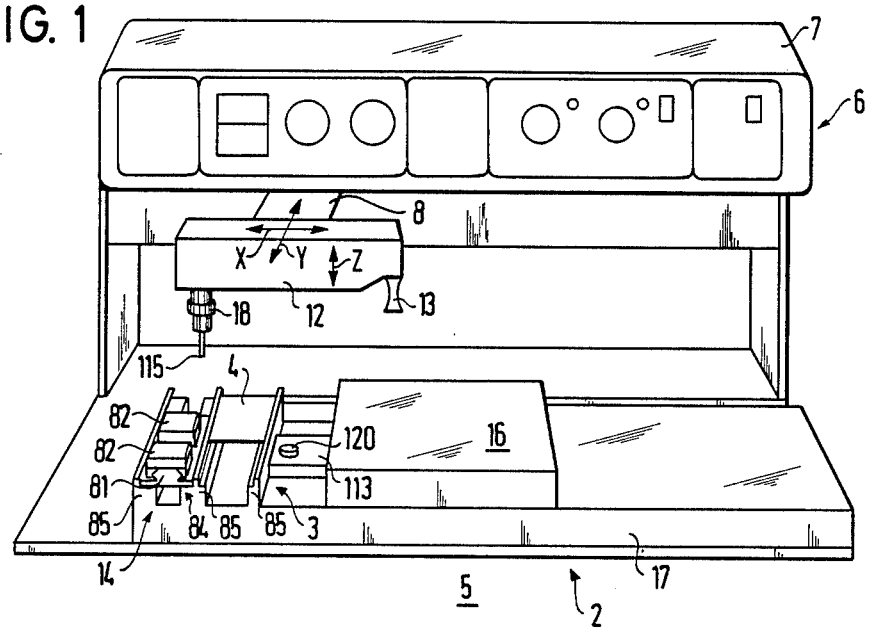
FIG. 1 shows a device designed according to the invention for mounting and/or soldering or cementing electronic components on printed circuit boards in a perspective view from the front.
Figure 7:
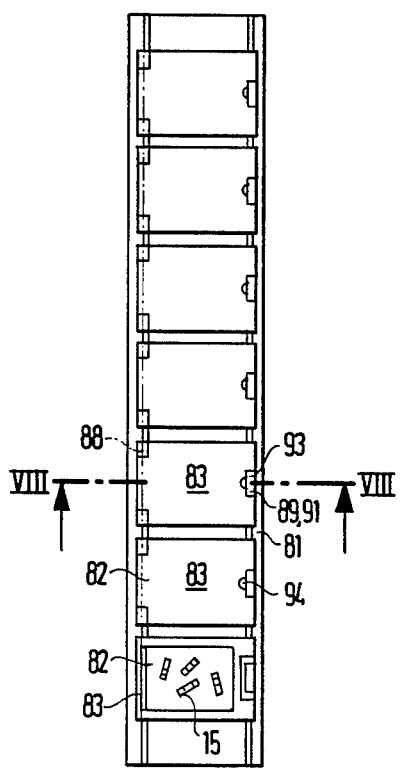
FIG. 7 shows a magazine for the device in a plan view.

In the present exemplary embodiment the mounting tool on the mounting head 12 is a suction needle by means of a which a component 15 is removed from the magazine 14 and deposited on the printed circuit board 4 at the predetermined point. For this purpose after switching on an air-suction pump (not shown), which is connected to the suction needle 18 by means of a hose connection the suction needle is guided to the magazine box 82 containing the predetermined component 15: for simplicity only two boxes 82 are shown in FIG. 1. The movement of the suction needle 18 is effected by displacing as desired the mounting head 12 in the three directions of movement X, Y, Z already described. Opening the predetermined magazine box 82 is done by means of the suction needle 18, for which purpose the latter is displaced either downwards from above against the inclined surface 93 or from the side against the catch 91 or the latch arm 92. As soon as the latch is released the hinged lid 83 concerned springs open and the suction needle 18 can be lowered into the opened magazine box 82 to pick up a component 15 by means of the air suction at the suction tip 115 of the suction needle. The suction needle is then moved over the printed circuit board 4, and by displacing the mounting head 12 downwards is placed on the specific point where the component is to be mounted. As soon as the component 15 is placed on the printed circuit board 4 a relative movement between the suction needle 18 and the mounting head 12 is effected by a further small displacement of the mounting head 12 downwards, the mounting head being displaced downwards relative to the suction needle 18. This movement causes the switch element 62 to be moved upwards by the suction needle 18, thus closing the switch 61 which causes the brakes 28, 29 to operate and cuts off the suction air from the suction needle 115. The operation of the brakes 28, 19 fixes the suction needle 18 in position in the horizontal plane so that lateral displacement or slipping out of this mounting position is no longer possible.

Operation of a tiltable switch member 116 of a switch 117, which in the present exemplary embodiment is also located on the top of the mounting head 12, above the suction needle 18, also actuates the third brake 51, so that the suction needle 18 is held in position in all directions of movement X, Y and Z. In this position the suction needle performs the function of supporting the component located between its tip and the printed circuit board. This is of particular advantage in cases in which the component is to be fixed to the printed circuit board 4 by a further manual operation, for example soldering or cementing. Because the suction needle 18 is also held in the vertical Z direction of movement, the mounting head 12 no longer needs to be held by hand, so that the operator has both hands free, for example to guide the solder with one hand and a soldering iron with the other.

Further manual operation of the switch member 116 enables the switch 117, and thus also the brake 51 that acts in the vertical Z direction of movement, to be switched off, so that the mounting head can be raised, or is raised by the force of the leaf spring 66. At the same time, i.e. by the resulting relative movement between the mounting head 12 and the suction needle 18, the operation of the switch 61 is ended and thus the brakes 28, 29 are also released, so that a new mounting or repair operation can take place. The connection of the suction air to pick up a component from the printed circuit board 4 (repair) or a next component 15 from the magazine 14 occurs automatically by slight pressure of the suction needle 18 against the component, whereby the switch 61 is operated and the suction air is connected.

Figure 8:
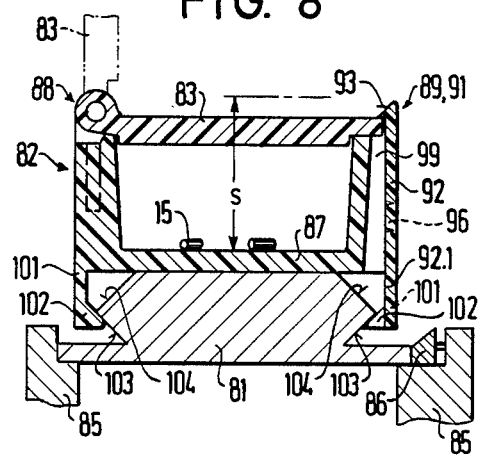
FIG. 8 shows the section on the line VIII—VIII in FIG. 7.
Figure 9:
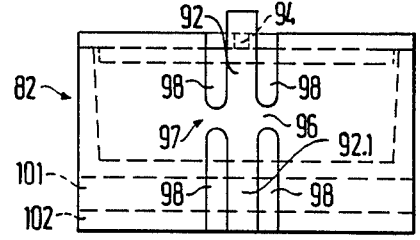
FIG. 9 shows a magazine box of the magazine in side elevation.

In opening the lid 83 the suction needle is generally pushed in and the switch 61 operated. To prevent the brakes 28, 29 being engaged in this case, the switch 71 that controls this must be set at the position S (FIG. 8) that is determined by the height of the magazine box. In other words, in the present exemplary embodiment the engagement of the brakes 28, 29 and the turning off of the suction air is only possible when the switch 71 is operated, i.e. in the lower region of the Z movement.

Figure 4:
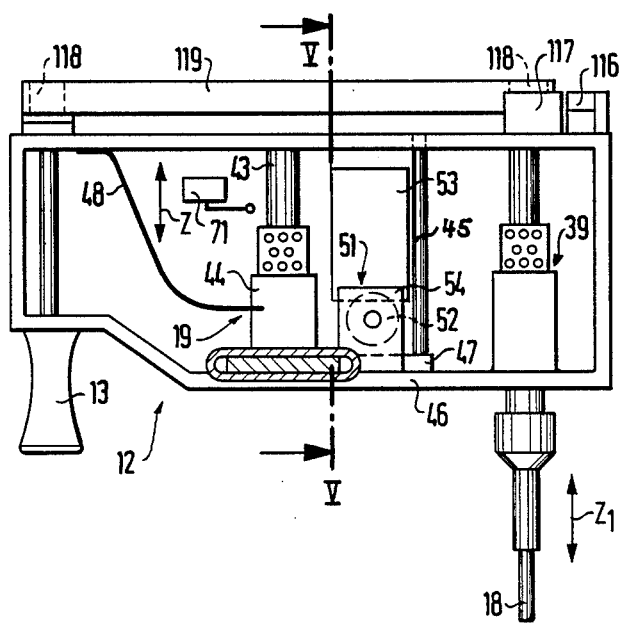
FIG. 4 shows a rear view of the opened tool head.
Figure 5:
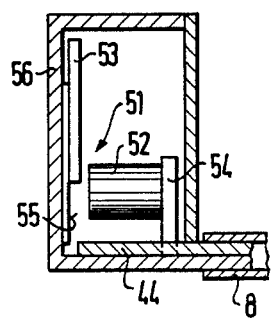
FIG. 5 shows a section on the line V—V in FIG.4.
Figure 6:
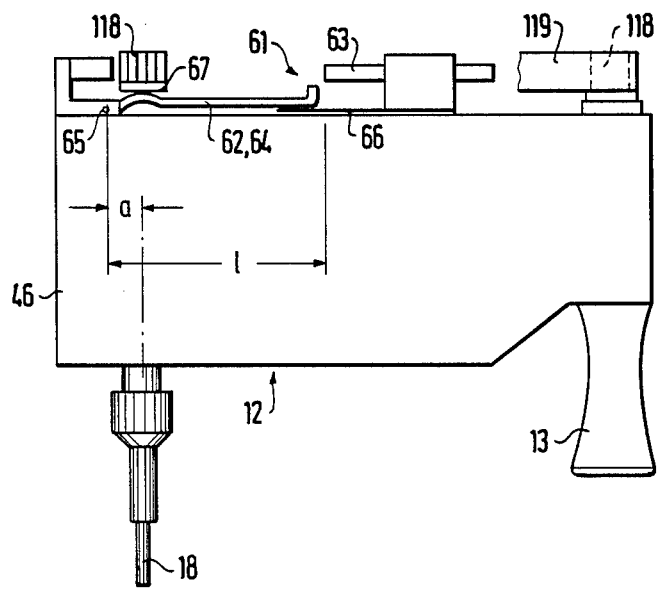
FIG. 6 shows the tool head in front elevation.

As can be seen from FIGS. 2, 4 and 6, the suction needle 18 and thus also the component 15 that it carries can be turned as desired about the longitudinal axis of the suction needle. For this purpose both the suction needle 18 and the handle 13 are mounted to turn about its vertical axis in the mounting head and a turning drive, preferably a belt drive with belt pulleys 118 and a belt 119, preferably a toothed belt, is provided between the upper ends of the suction needle 18 and the shaft of the handle 13 that passes through the mounting head 13.

Figure 10:
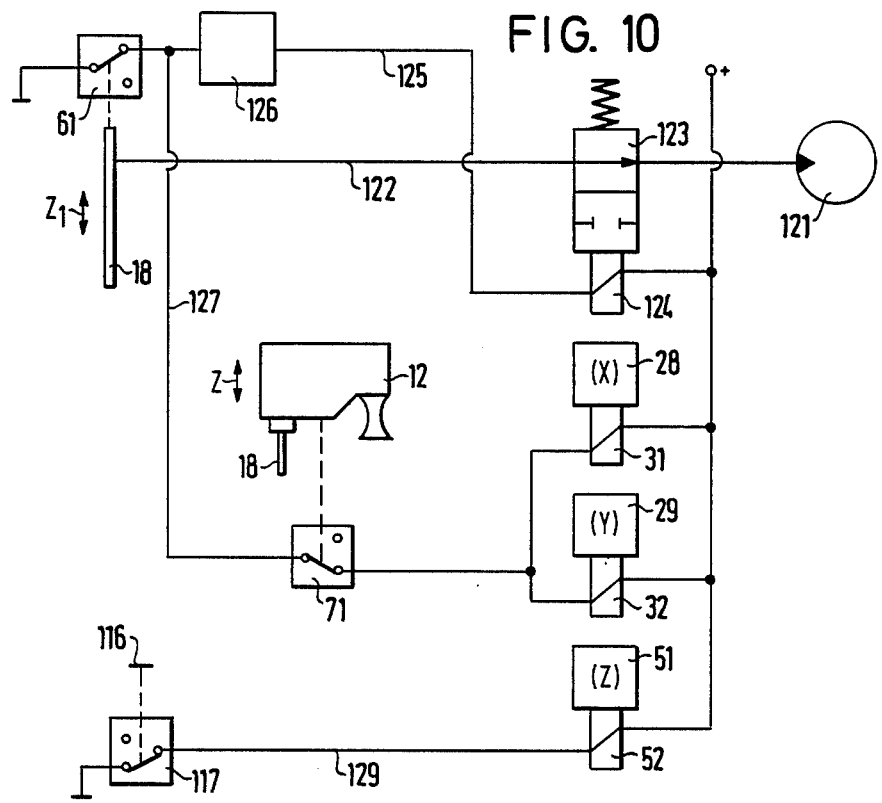
FIG. 10 shows an electric circuit diagram for the device.

As is shown by the circuit diagram in FIG. 10, an electromagnetically operated shut-off valve 123 is arranged in the suction line 122 leading from a source of vacuum 121 to the suction needle 18, with its electromagnet 124 connected by an electrical lead 125 to the switch 61 and also - depending on whether the circuit is a simple electric circuit or an electronic circuit — to a changeover switch 126 or a flip-flop. By this means successive operations of the switch 61 switch the changeover switch 126 alternately on and off. Branching off between the switches 61 and 126 is an electrical lead 127 in which the switch 71 is arranged and in the further course of which the electromagnets 31 and 32 of the brakes 28 and 29 are arranged. The circuit diagram shows the suction needle 18 in the raised position (switch 61 is closed) and the mounting head 12 in the lowered position, so that the brakes 28, 29 can be engaged. In the raised position of the mounting head 12 engagement of the brakes 28, 29 is, as desired, not possible. Engagement and disengagement of the brakes 28, 29 thus depends first on the switch 71 and second on the switch 61, and is independent of the position of the changeover switch 126. In contrast to this, the brake 51 that acts in the vertical Z direction of movement can, as desired, be engaged and disengaged by manual operation of the switch 117 independent of the operating situations described above. The electromagnet 52 of the brake 51 is located in an electrical lead 129 leading from the switch 117.

Figure 11:
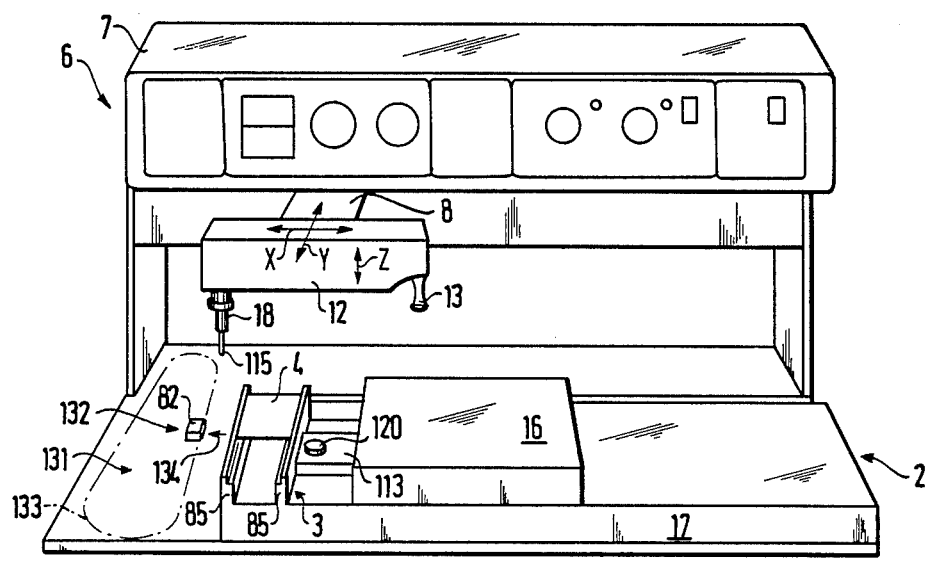
FIG. 11 shows a magazine as a modified exemplary embodiment.

The embodiment shown in FIG. 11 differs from that described above in that the magazine boxes of the magazine 4 are not opened by the suction needle 18 but automatically. To do this the magazine boxes 82, of which only one is shown, of the magazine (here numbered 131) are moved into a ready-use position for the removal of one or more components 15 and are automatically opened in this ready-use position, which is indicated generally by 132. In the present exemplary embodiment the magazine boxes 82 are arranged to circulate on a transport means, e.g. a conveyor belt 133. Immediately before or in the ready-use position 132 the respective closure mechanism is opened. This can be done by a stop or in the present exemplary embodiment by a pressure piece 134 which is either separately operated or projects into the path of movement of the magazine box 82. In the present exemplary embodiment a flexible pressure piece 134 is used with which the latch arm 92.1 comes into contact in the use position and is operated by the pressure piece 134 to release the latch of the hinged lid, so that the hinged lid 83 springs open. Since the pressure piece 134 is flexibly mounted it can simply be pressed in by the associated side wall of the magazine box 82 concerned and be pushed forward on contact with the latch arm 92.1 because of its resilience and allow the hinged lid 82 to open.

In the two embodiments described above the hinged lid 82 is closed again by hand after removal of the component 15 required. In the second embodiment, as shown in FIG. 11, this can also be done automatically, and in particular during the further movement of the magazine box 82 from the use position 132. In this embodiment the switch 71 is not needed.

In its other details the second embodiment shown in FIG. 11 corresponds to the first embodiment shown in FIGS. 1 to 10, so that no further description of its functioning is required.

What is claimed is:

1. An apparatus for mounting, soldering or cementing electronic components on printed circuit boards, having a first carrier for at least one circuit board and a second carrier for the component, the first and second carriers being displaceable relative to one another parallel to the plane of the circuit board and transverse thereto, and having a magazine for the components which the chambers to receive the components, wherein said chambers can be opened and closed by a lid with a fastening mechanism and the fastening mechanism can be opened by said second carrier for the component.

2. An apparatus according to claim 1 wherein the lid can be latched in its fastened position by a latch member that can be moved out of its engaged position by the said second carrier.

3. Apparatus according to claim 2 wherein said latch member can be moved out of its engaged position by a vertical movement of said second carrier and has an inclined face accessible from above for its operation.

4. Apparatus according to claim 2 wherein said latch member is movable substantially horizontally.

5. Apparatus according to claim 1 wherein said chambers are formed in removable and identical magazine boxes.

6. Apparatus according to claim 5 wherein the magazine boxes can be fixed to a third carrier on the apparatus, by clamping or latching.

7. Apparatus according to claim 6 wherein a plurality of magazine boxes can be fixed to a carrier rail part that can be fixed on said third carrier.

8. Apparatus according to claim 7 wherein said carrier part can be fixed to said third carrier by latching or clamping.

9. Apparatus according to claim 1 wherein the lid is spring biassed towards its open position.

10. Apparatus according to claim 1 wherein the lid is a hinged lid.

11. Apparatus according to claim 1 wherein when the magazine is in position in the apparatus the bottom of the magazine box is substantially in the plane of the printed circuit board.

12. Apparatus according to claim 1 wherein the chambers are formed in removable and identical magazine boxes.

13. Apparatus according to claim 12 wherein the magazine boxes can be fixed on a further carrier on the apparatus, by clamping or latching.

14. Apparatus according to claim 13 wherein a plurality of magazine boxes can be fixed on a carrier rail part that can be fixed on said further carrier.

15. Apparatus according to claim 14 wherein the carrier part can be fixed to said further carrier by latching or clamping.

16. Apparatus for mounting, soldering or cementing electronic components on printed circuit boards, having a first carrier for at least one circuit board and a second carrier for the component, the first and second carriers being displaceable relative to one another parallel to the plane of the circuit board and transverse thereto, and having a magazine for the components which has chambers to receive the components, wherein said chambers comprise magazine boxes with a lid that can be opened and closed by a fastening mechanism, the magazine boxes can be moved on a track into a use position, and a mechanism for opening the lid of the magazine box is provided in the respective use position.

17. Apparatus according to claim 16 wherein the lid can be latched in its fastened position.

18. Apparatus according to claim 16 wherein the magazine boxes are movable on a circulating track which comprises a circulating conveyor belt.

19. Apparatus for mounting, soldering or cementing of electronic components on printed circuit boards, having a carrier for the component and a magazine for the components that has chambers to receive the components, said carrier and said magazine being displaceable relative to one another, wherein the chambers can be opened and closed by a lid with a fastening mechanism and the fastening mechanism can be opened by the carrier for the component.

20. Apparatus according to claim 19 wherein the lid can be held in its fastened position by a latch member that can be moved from its engaged position by the carrier.

21. Apparatus according to claim 20 wherein the latch member can be moved out of its engaged position by a vertical movement of said carrier and has an inclined face accessible from above to operate it.

22. Apparatus according to claim 20 wherein the latch member is movable substantially horizontally.

23. Apparatus according to claim 19 wherein the lid is spring biased towards it open position.

24. Apparatus according to claim 19 wherein the lid is a hinged lid.

25. Apparatus according to claim 19 wherein when the magazine is in position in the apparatus the bottom of the magazine box is substantially in the plane of the printed circuit board.

26. Apparatus for mounting, soldering or cementing of electronic components on printed circuit boards, having a carrier for the component and a magazine for the components that has chambers to receive the components, said carrier and said magazine being displaceable relative to one another, wherein said chambers comprise magazine boxes with a lid that can be opened and closed by a fastening mechanism, the magazine boxes can be moved on a track into a use position, and a mechanism for opening the lid of the magazine box is provided in the respective use position.

27. Apparatus according to claim 26 wherein the lid can be latched in its fastened position.

28. Apparatus according to claim 26 wherein the magazine boxes are movable on a circulating track which comprises a circulating conveyor belt.

* * * * *

UNITED STATES PATENT AND TRADEMARK OFFICE
CERTIFICATE OF CORRECTION

PATENT NO. : 4,934,578

DATED : June 19, 1990

INVENTOR(S) : Adalbert Fritsch

It is certified that error appears in the above-identified patent and that said Letters Patent is hereby corrected as shown below:

On the title page, item [57]:
In the Abstract, line 3: "haing" should read as --having--

Column 9, line 21, Claim 1: "which the chambers" should read as --which has chambers--

Signed and Sealed this

Twelfth Day of November, 1991

Attest:

HARRY F. MANBECK, JR.

*Attesting Officer*     *Commissioner of Patents and Trademarks*